United States Patent
Mulder et al.

(10) Patent No.: US 10,256,021 B2
(45) Date of Patent: Apr. 9, 2019

(54) SUPERCONDUCTING MAGNET WITH CRYOGENIC THERMAL BUFFER

(71) Applicant: KONINKLIJKE PHILIPS N.V., Eindhoven (NL)

(72) Inventors: Gerardus Bernardus Jozef Mulder, Eindhoven (NL); Philip Alexander Jonas, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 202 days.

(21) Appl. No.: 15/508,945

(22) PCT Filed: Sep. 9, 2015

(86) PCT No.: PCT/EP2015/070616
§ 371 (c)(1),
(2) Date: Mar. 6, 2017

(87) PCT Pub. No.: WO2016/038093
PCT Pub. Date: Mar. 17, 2016

(65) Prior Publication Data
US 2017/0263361 A1    Sep. 14, 2017

(30) Foreign Application Priority Data

Sep. 9, 2014 (EP) .................................. 14184035

(51) Int. Cl.
*H01F 6/04* (2006.01)
*G01R 33/3815* (2006.01)
*H01F 6/06* (2006.01)

(52) U.S. Cl.
CPC .......... *H01F 6/04* (2013.01); *G01R 33/3815* (2013.01); *H01F 6/06* (2013.01)

(58) Field of Classification Search
CPC .......... H01F 6/04; H01F 6/06; G01R 33/3815
See application file for complete search history.

(56) References Cited

U.S. PATENT DOCUMENTS 4,689,970 A * 9/1987 Ohguma ................... H01F 6/04
    165/288
5,396,207 A * 3/1995 Dorri ................. G01R 33/3815
    324/318

(Continued)

FOREIGN PATENT DOCUMENTS

EP    151719 A2    8/1985

*Primary Examiner* — G.M. A Hyder (57) ABSTRACT

A superconducting magnet device (14; 46), including at least one coil winding ($16_1$-$16_4$) of superconducting wire, configured for generating a static magnetic field $B_0$, wherein the at least one coil winding ($16_1$-$16_4$) is adapted to establish a thermally conductive contact with a cold head (38) of a cryocooler that is configured for bringing to and keeping the at least one coil winding ($16_1$-$16_4$) at a temperature below the critical temperature, and at least one gas-tight container (40;48) that permanently contains an amount of helium, wherein the at least one gas-tight container (40; 48) is in thermally conductive contact to the at least one coil winding ($16_1$-$16_4$) for taking up thermal energy from the at least one coil winding ($16_1$-$16_4$) in at least one operational state; and a magnetic resonance imaging system (10) that is configured for acquiring magnetic resonance images from at least a portion of a subject of interest (22), comprising such a superconducting magnet device (14; 46) for generating a static magnetic field $B_0$ in an examination space (20) of the magnetic resonance imaging system (10).

11 Claims, 4 Drawing Sheets

(56) References Cited

U.S. PATENT DOCUMENTS

| | | | |
|---|---|---|---|
| 5,410,286 A | | 4/1995 | Herd et al. |
| 5,446,433 A | * | 8/1995 | Laskaris ............ G01R 33/3815 335/216 |
| 5,651,256 A | | 7/1997 | Herd et al. |
| 5,782,095 A | | 7/1998 | Chen et al. |
| 6,107,905 A | * | 8/2000 | Itoh ..................... F17C 3/085 335/216 |
| 6,147,579 A | | 11/2000 | Einzinger et al. |
| 6,185,808 B1 | | 2/2001 | Ranze et al. |
| 7,498,814 B1 | | 3/2009 | Huang et al. |
| 2011/0179808 A1 | * | 7/2011 | Kagan ................ F25D 19/00 62/48.2 |
| 2012/0025821 A1 | | 2/2012 | Strobel et al. |
| 2012/0196753 A1 | | 8/2012 | Laskaris et al. |
| 2013/0147485 A1 | | 6/2013 | Yokoi |
| 2013/0157865 A1 | * | 6/2013 | Shen ................ G01R 33/3804 505/162 |
| 2013/0203603 A1 | | 8/2013 | Harrison |
| 2016/0091142 A1 | * | 3/2016 | Wikus ............... G01R 33/3804 324/309 |

\* cited by examiner

SUPERCONDUCTING MAGNET WITH CRYOGENIC THERMAL BUFFER

CROSS REFERENCE TO RELATED APPLICATIONS

This application is a U.S. national phase application of International Application No. PCT/EP2015/070616, filed on Sep. 9, 2015, which claims the benefit of EP Application Serial No. 14184035.5 filed on Sep. 9, 2014 and is incorporated herein by reference.

FIELD OF THE INVENTION

The invention pertains to a superconducting magnet device, and a magnetic resonance imaging system including such a superconducting magnet device.

BACKGROUND OF THE INVENTION

In the field of superconducting magnets it is known to employ a cooling technology with little or even no cryogenic liquid such as liquid helium. Superconducting magnets of this type are often referred to as "cryogen-free magnets" and have the obvious advantage of hardly containing or consuming helium. Due to the absence of a reservoir of cryogenic liquid, however, the thermal buffering capability of cryogen-free magnet is limited. The U.S. Pat. No. 5,410,286 discloses a cryocooler-cooled superconducting magnet with a thermal buffer assembly in contact with the magnet cartridge that includes the superconducting wire. This known thermal buffer assembly is coupled via a passing gas charge/discharge system to a He-source and to ambient air.

SUMMARY OF THE INVENTION

It is desirable to provide a cryogen-free superconducting magnet with improved thermal buffering capacity at cryogenic temperatures.

In one aspect of the present invention, the object is achieved by a superconducting magnet device, including at least one coil winding of superconducting wire having a critical temperature, configured for generating a static magnetic field, wherein the at least one coil winding is adapted to establish a thermally conductive contact with a cold head of a cryocooler that is configured for bringing to and keeping the at least one coil winding at a temperature below the critical temperature, and at least one gas-tight container that permanently contains an amount of helium, in fluid-isolation wherein the at least one gas-tight container is in thermally conductive contact to the at least one coil winding for taking up thermal energy from the at least one coil winding in at least one operational state.

The phrase "permanently containing", as used in this application, shall be understood particularly such that the at least one gas-tight container does not comprise any venting provision of any kind, so that after filling the amount of helium is never changed during a lifetime of the gas-tight container. That is the amount of Helium is in the gas-tight container in fluid-isolation from cooling liquids (if any) that are employed to cool the super conducting wires below the critical temperature.

At cryogenic temperatures, for instance below 10 K, the specific heat capacity (i.e. the heat capacity per unit mass) of helium gas exceeds the specific heat capacities of most metals by many orders of magnitude (e.g. for aluminum, the factor is about 30,000 at 4 K).

When warmed up to room temperature, the amount of helium will build up an overpressure that needs to be taken by the gas-tight container. For example:

A filling of 1 kg/m$^3$ helium results in a gas pressure of 6 bar at 300 K, and an enthalpy change of 5 kJ/m$^3$ from 4 K to 5 K. At 4 K, the filling is gaseous to 100%.

A filling of 10 kg/m$^3$ helium results in a gas pressure of 64 bar at 300 K, and an enthalpy change of 50 kJ/m$^3$ from 4 K to 5 K. At 4 K, the filling is gaseous to 100%.

A filling of 100 kg/m$^3$ helium results in a gas pressure of 866 bar at 300 K, and an enthalpy change of 500 kJ/m$^3$ from 4 K to 5 K. At 4 K, the filling is supercritical.

Thus, in a suitable embodiment, by the extra thermal capacity provided by the at least one gas-tight container, a substantial amount of ride-through time can be accomplished for events such as power outage, outage of cooling liquid of the cryocooler, cryocooler maintenance or recoverable failure of the cryocooler. By that, ramping down of the static magnetic field in the occurrence of any such event as a safety precaution and a subsequent time-consuming ramping up of the static magnetic field generated by the superconducting magnet device can be omitted.

Preferably, the at least one gas-tight container contains an amount of helium that is equivalent to a filling with pressurized helium gas of 50 bar to 500 bar at room temperature.

Further, the extra thermal capacity provided by the at least one gas-tight container can allow for temporarily exceeding a cooling capacity of the cold head of the cryocooler. As a consequence, the cooling capacity of the cold head of the cryocooler can be designed not for peak thermal load, generated for instance by a temporary operation of a component, but rather for a thermal load that is averaged over a time constant. The time constant is determined by the extra thermal capacity of the at least one gas-tight container and the thermal conductivity on the path from the origin of heat generation to the at least one gas-tight container. In this way, a cryocooler with a lower cooling capacity can be used for the same purpose than without the at least one gas-type container.

In a preferred embodiment, the superconducting magnet device further comprises at least one superconducting member that is distinct from the at least one coil winding and has a critical temperature, wherein the at least one gas-tight container is in fluid-isolation and in thermally conductive contact to the at least one superconducting member for taking up thermal energy from it in at least one operational state. The phrase "superconducting member", as used in this application, shall in particular encompass other superconducting coil windings, superconducting joints and superconducting switches. In this way, additional thermal capacity can be provided both for the at least one coil winding and for another superconducting member of the superconducting magnet device that critically depend on cooling. A further safety margin for omitting a ramping down of the static magnetic field in the occurrence of any such event as a safety precaution in the occurrence of power outage, outage of cooling liquid of the cryocooler, cryocooler maintenance, recoverable failure of the cryocooler, or any other event that jeopardizes the superconducting function of the at least one coil winding and another superconducting member can be accomplished by this.

In a further preferred embodiment, the superconducting magnet device comprises at least two gas-tight containers that permanently contain an amount of helium, in fluid-isolation wherein the one gas-tight container of the two gas-tight containers is in thermally conductive contact to the at least one coil winding for taking up thermal energy from the at least one coil winding in at least one operational state, and the other gas-tight container of the two gas-tight containers is in thermally conductive contact to the at least one superconducting member for taking up thermal energy from the at least one superconducting member in at least one operational state. In this way, the provided additional thermal capacity can specifically be designed according to individual cooling requirements of the superconducting coil winding in the superconducting member, respectively, by varying the amount of helium contained in the at least two gas-tight containers of individual size.

In another preferred embodiment, the amount of helium contained, i.e. the filling, in the at least one gas-tight container lies in a range between 25 kg/m$^3$ and 35 kg/m$^3$. In this range of filling, a gas pressure would be approximately 200 bar at room temperature (about 300 K). At a temperature of 4.2 K, the gas pressure would be approximately 1 bar, and the gas-tight container would contain a mixture of liquid and gaseous helium. In this way, a larger amount of thermal capacity can be provided due to exploiting the latent heat of evaporation of the amount of liquid helium.

In yet another preferred embodiment, the superconducting magnet device comprises a plurality of gas-tight containers, each gas-tight container of the plurality of gas-tight containers containing an individual amount of helium, wherein the gas-tight containers are in thermally conductive contact to at least one out of the at least one coil winding and the at least one superconducting member that is distinct from the at least one coil winding. In this way, all the superconducting members of the superconducting magnet device can be provided with additional thermal capacity at cryogenic temperatures below their critical temperature, on the basis of individual cooling requirements. A further safety margin for omitting a ramping down of the static magnetic field as a safety precaution in the occurrence of power outage, outage of cooling liquid of the cryocooler, cryocooler maintenance, recoverable failure of the cryocooler, or the like defense can be accomplished.

Preferably, the at least one gas-tight container or the gas-tight containers of the plurality of gas-tight containers are substantially made from a lightweight metal. The phrase "substantially", as used in this application, shall be understood particularly as to more than 50%. It shall in particular also encompass the case that the gas-tight container is completely (to 100%) made from the lightweight metal.

The phrase "lightweight metal", as used in this application, shall be understood particularly to encompass metals having a specific mass density of less or equal to 5.0 g/cm$^3$, more preferably less than or equal to 3.0 g/cm$^3$. Examples for lightweight metals are titanium and its alloys, and pure aluminum and aluminum-alloys comprising at least one of magnesium, lithium and beryllium. In principle, other lightweight metals that appear suitable to the one skilled in the art could be employed as material for the gas-tight containers.

In another embodiment, the plurality of gas-tight containers is held with a solid matrix. In one embodiment, the amount of helium contained in the at least one gas-tight container may be split among the plurality of gas-tight containers, as a ratio of the mass of the amount of helium and the total mass of the plurality of gas-tight containers is independent of a size of the gas-tight containers. As a result, a composite material can be obtained with a very high thermal capacity at cryogenic temperatures such as less than 10 K. Furthermore, a faster thermal diffusivity can be accomplished by such a composite material, as the heat propagates through material of less thickness. Another advantage of such a composite material lies in that the superconducting magnet device might fall in a lower category regarding pressure vessel regulations (per product of gas pleasure and volume), so that the effort for complying with safety regulations can be reduced in this regard.

In one embodiment, the at least one cold head of the cryocooler has a nominal operation temperature of 4 K. In combination with the properties of helium in a temperature regime about this nominal operation temperature an effective thermal buffer can be provided for the superconducting magnet device.

In another aspect of the present invention, an embodiment of one of the disclosed superconducting magnet devices or a combination thereof is provided, wherein the at least one coil winding of superconducting wire is in thermally conductive contact with the cold head of a cryocooler that is configured for bringing to and keeping the at least one coil winding at a temperature below the critical temperature.

In one embodiment, the superconducting magnet device is provided for use as main magnet of a magnetic resonance imaging system, and is configured for generating a static magnetic field in an examination space of the magnetic resonance imaging system.

In yet another aspect of the present invention, a magnetic resonance imaging system is provided that is configured for acquiring magnetic resonance images from at least a portion of a subject of interest, and comprises an embodiment of one of the disclosed superconducting magnet devices or a combination thereof.

BRIEF DESCRIPTION OF THE DRAWINGS

These and other aspects of the invention will be apparent from and elucidated with reference to the embodiments described hereinafter. Such embodiment does not necessarily represent the full scope of the invention, however, and reference is made therefore to the claims and herein for interpreting the scope of the invention.

In the drawings.

DETAILED DESCRIPTION OF EMBODIMENTS

Figure 1:
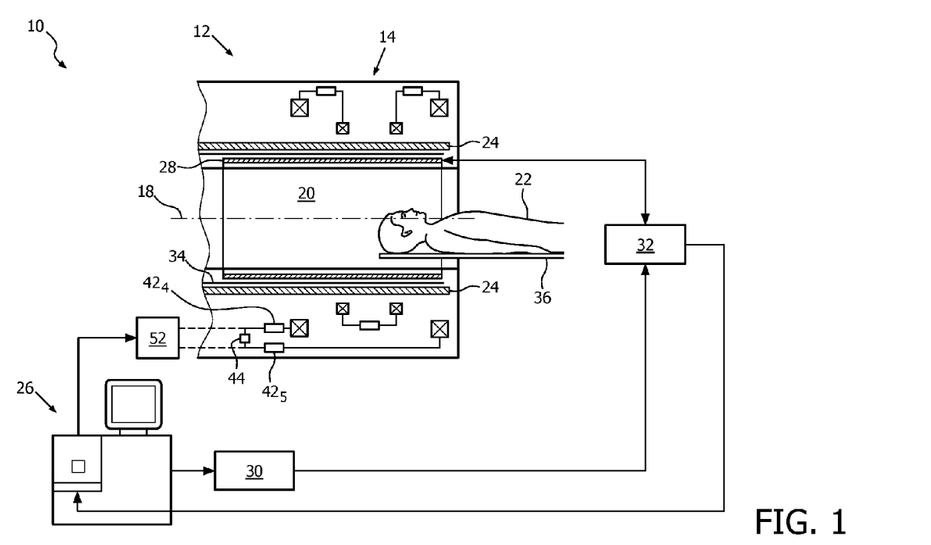
FIG. 1 shows a schematic set up of a superconducting magnet device in accordance with the invention, FIG. 2 schematically illustrates a detail of the superconducting magnet device pursuant to FIG. 1.

FIG. 1 shows a schematic partial view of a magnetic resonance imaging system 10 comprising a superconducting magnet device 14 in accordance with the invention. The superconducting magnet device 14 includes four circular coil windings $16_1$-$16_4$ (FIG. 2) of superconducting wire consisting of electrically insulated niobium-titanium having a critical temperature of about 9.2 K. The four coil windings $16_1$-$16_4$ are arranged perpendicular to a common center axis 18. The superconducting magnet device 10 is configured for use as main magnet of the magnetic resonance imaging system 10 and, specifically, for generating a static magnetic field $B_0$ in an examination space 20 of a scanner unit 12 of the magnetic resonance imaging system 10, which in turn is configured for acquiring magnetic resonance images from at least a portion of a subject of interest 22. The magnetic resonance imaging system 10 further includes a magnetic gradient coil system 24 configured for generating gradient magnetic fields superimposed to the static magnetic field $B_0$.

Furthermore, the magnetic resonance imaging system 10 includes a radio frequency antenna device 28 designed as a cylindrical whole-body coil that is provided for applying a radio frequency excitation field $B_1$ to nuclei of or within the subject of interest 22 for magnetic resonance excitation during radio frequency transmit time periods to excite the nuclei of or within the subject of interest 22 for the purpose of magnetic resonance imaging. To this end, radio frequency power is fed, controlled by a control unit 26 of the magnetic resonance imaging system 10, from a radio frequency transmitter 30 via a transmit/receive switch 32 to the whole-body coil. The whole-body coil has a center axis and, in the operational state, is arranged concentrically within a bore of the superconducting magnet device such that the center axis of the whole-body coil and the center axis 18 of the superconducting magnet device coincide. As is well known in the art, a cylindrical metal radio frequency shield 34 is arranged concentrically between the magnetic gradient coil system 24 and the whole-body coil.

The whole-body coil is also provided for receiving magnetic resonance signals during radio frequency receive phases from the nuclei of or within the portion of the subject of interest 22 that have been excited by the transmitted radio frequency field $B_1$. The received magnetic resonance signals are transferred from the whole-body coil via the transmit/receive switch 32 to a signal processing unit of the control unit 26, which is also configured for controlling further functions of the magnetic resonance imaging system 10. In an operational state of the magnetic resonance imaging system 10, radio frequency transmit phases and radio frequency receive phases are taking place in a consecutive manner.

Further, the magnetic resonance imaging system 10 includes a patient table 36 for supporting the subject of interest 22 and for positioning the subject of interest 22 within the examination space 20. All these components of the magnetic resonance imaging system 10 are well known in the field of magnetic resonance imaging and will therefore neither be discussed in more detail nor shown in the figures herein.

Figure 2:
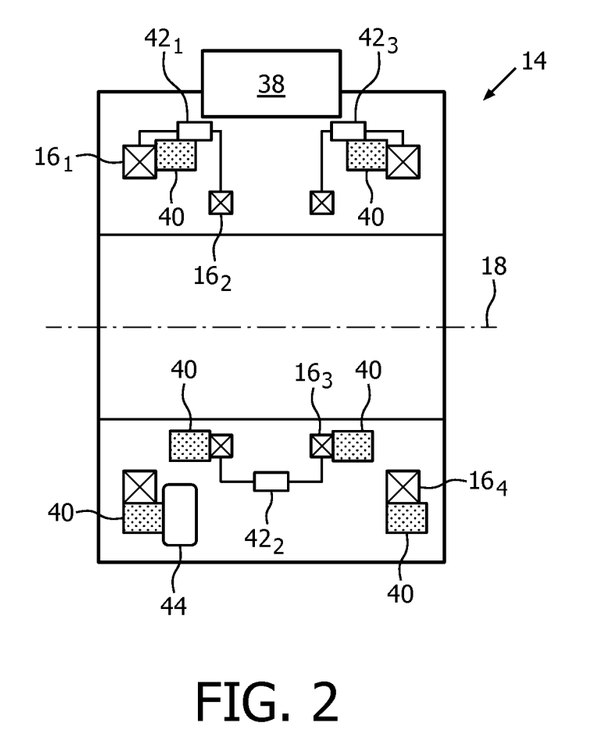

As illustrated by FIG. 1 and by FIG. 2 in a detailed view, the superconducting magnet device 14 further comprises superconducting members $42_1$-$42_5$, 44 that are distinct from the four coil windings $16_1$-$16_4$ of superconducting wire. Three superconducting members are designed as superconducting joints $42_1$-$42_3$ that connect ends of distinct coil windings of the four coil windings $16_1$-$16_4$ so as to provide a superconducting path for an electric current to flow through all four coil windings $16_1$-$16_4$. One superconducting member is designed as a superconducting switch 44 that is electrically connected in parallel by two more superconducting joints $42_4$-$42_5$ to the four superconducting coil windings $16_1$-$16_4$, so as to allow for operating the superconducting coil windings $16_1$-$16_4$ of the superconducting magnet device 14 in a persistent mode after ramping up the current provided by a power supply 52 through all four coil windings $16_1$-$16_4$, as is well known in the art. Superconducting switches and superconducting joints are known to have deteriorated properties with regard to superconductivity relative to the undisturbed superconducting wire, and therefore are known to require particular attention regarding cooling.

The four coil windings $16_1$-$16_4$ of superconducting wire are in thermally conductive contact with a cold head 38 of a stage of a cryocooler of the Gifford-McMahon (GM) type (FIG. 2), which is widely used in magnetic resonance imaging. The GM cryocooler is configured for bringing the four coil windings $16_1$-$16_4$ of superconducting wire from room temperature down to a nominal operating temperature of 4 K and for keeping them at this nominal operating temperature, which is well below the critical temperature of the superconducting wire.

Further, the superconducting magnet device 14 comprises a plurality of gas-tight containers 40 that are completely made from lightweight metal aluminum. Each gas-tight container 40 of the plurality of gas-tight containers 40 permanently contains a helium filling in the range between about 25 kg/m³ to 35 kg/m³. This has been accomplished by filling each of the containers 40 in an open state at room temperature via a filling nozzle with pressurized helium gas at about 205 bar pressure and by then pinching off the filling nozzle.

As indicated in FIG. 2, each gas-tight container 40 of the plurality of gas-tight containers 40 is in thermally conductive contact to at least one out of the four coil windings $16_1$-$16_4$ and/or to one of the superconducting members $42_1$-$42_5$, 44 that are distinct from the four coil windings $16_1$-$16_4$ for taking up thermal heat in at least one operational state.

Figure 3:
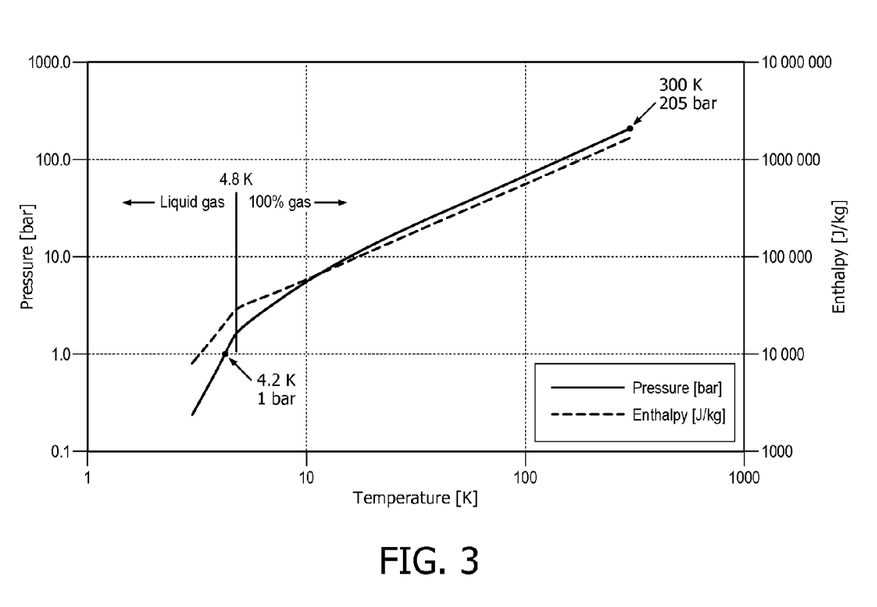
FIG. 3 illustrates pressure conditions and enthalpy, respectively, vs. temperature in the gas-tight container permanently containing a helium filling of 30 kg/m$^3$, and FIG. 4 schematically illustrates an alternative embodiment of a superconducting magnet device in accordance with the invention.

FIG. 3 illustrates pressure conditions and enthalpy level, respectively, vs. temperature in the gas-tight containers 40 permanently containing a helium filling of 30 kg/m³. It is noted that, when the gas-type containers 40 take up thermal heat, temperature and pressure of the helium filling will rise. The logarithmic scale for the enthalpy level shows that a substantial amount of thermal heat can be taken up by the gas-type containers 40.

In this way, a large thermal capacity at cryogenic temperatures can be provided as a thermal buffer in the occurrence of events such as power outage, outage of cooling liquid of the cryocooler, cryocooler maintenance or recoverable failure of the cryocooler, and the static magnetic field $B_0$ generated by the superconducting magnet device 14 does not have to be ramped down as a safety precaution.

A numerical example will illustrate the advantage of the invention: A gas-type container 40 of 13.2 l volume and a helium filling of 30 kg/m³ permanently contains an amount of 400 g of helium, which results in a heat capacity of about 5.0 kJ/K at a temperature of 4.2 K (equivalent to about 2500 kg of steel). Five such gas-type containers 40 can provide a heat capacity of about 25.0 kJ/K at 4.2 K, which is equivalent to 10 l of liquid helium, a thermal capacity that is adequate for operating a cryogen-free superconducting magnet device.

Figure 4:
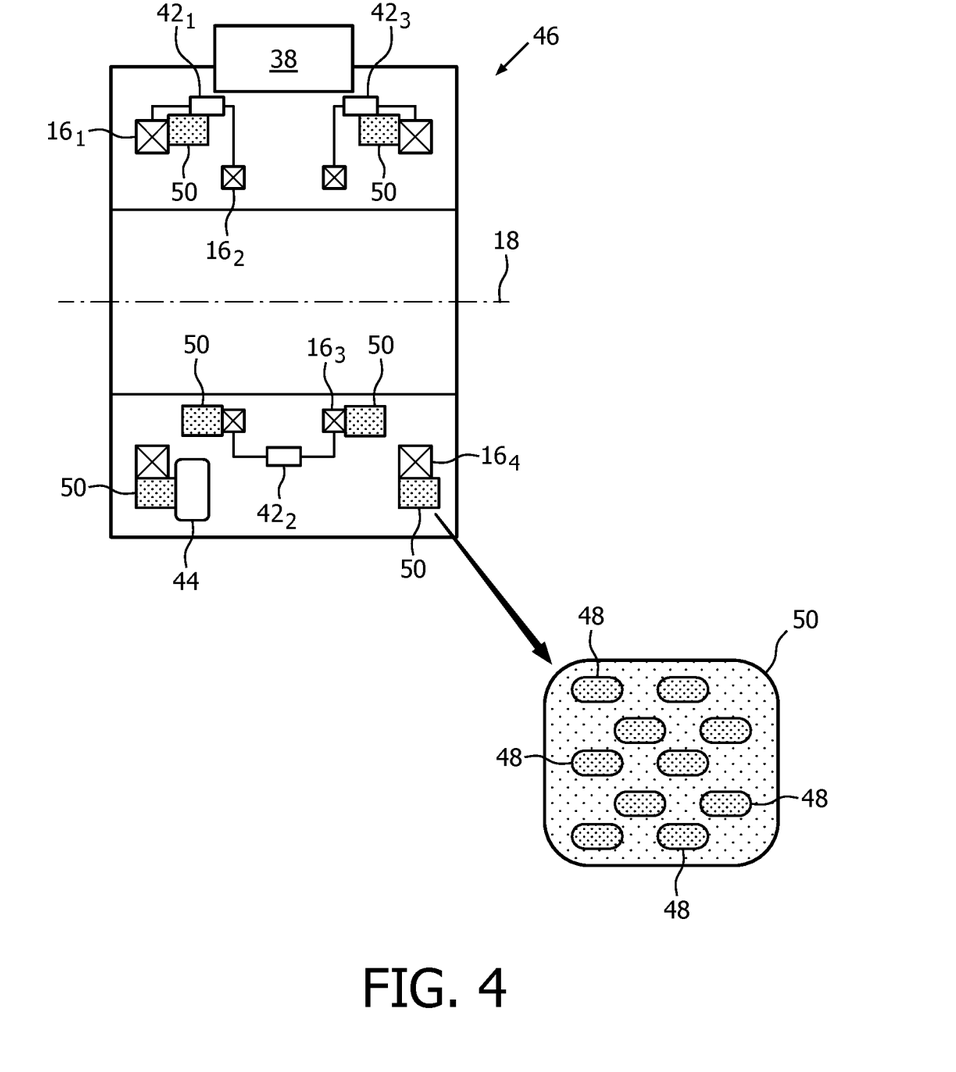

FIG. 4 schematically illustrates an alternative embodiment of a superconducting magnet device 46 in accordance with the invention. The superconducting magnet device 46 is equally designed to the superconducting magnet device 14 of the previous embodiment except for the design of gas-type containers 48. Therefore, the same reference numerals are used in FIG. 4 for those components of the alternative embodiment that are identical to the previous embodiment of the superconducting magnet device 14.

In the alternative embodiment, a plurality of gas-tight containers 48 of much smaller size than in the previous embodiment is held with a solid matrix material 50. Again, the gas-type containers 48 are made from aluminum and permanently contain a helium filling in the range between about 25 kg/m³ to 35 kg/m³. The ratio of the mass of helium contained and the mass of the gas-type container 48 without the helium filling is independent of the container size. Thus, the same advantageous properties with regard to heat capacity at cryogenic temperatures is accomplished as with the larger gas-type containers 40 of the previous embodiment. In addition, a larger thermal diffusivity can be accomplished, as the thermal heat has to propagate through material of less thickness to reach the helium.

Epoxy resin is used for the solid matrix 50, and the plurality of gas-type containers 48 has substantially been evenly arranged in the epoxy resin before its curing took place. For relieving mechanical stress, the epoxy resin may in addition be loaded with some inert filler material such as fine-grained quartz sand. Via the epoxy resin matrix 50, the plurality of gas-type containers 48 is in thermally conductive contact to the four coil windings $16_1$-$16_4$ and/or the superconducting members $42_1$-$42_5$, 44 distinct from the coil windings $16_1$-$16_4$ that are designed as superconducting contacts $42_1$-$42_5$ and a superconducting switch 44.

Whereas the numerical example of the previous embodiment mentioned a typical volume of the gas-tight containers 40 in the range of about 10 l, the typical volume of the gas-tight containers 48 in the present embodiment preferably is in the region of about 0.1 l or less.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage. Any reference signs in the claims should not be construed as limiting the scope.

REFERENCE SYMBOL LIST 10 magnetic resonance imaging system
12 scanner unit
14 superconducting magnet device
16 coil winding
18 center axis
20 examination space
22 subject of interest
24 magnetic gradient coil system
26 control unit
28 radio frequency antenna device
30 radio frequency transmitter
32 transmit/receive switch
34 radio frequency shield
36 patient table
38 cold head
40 gas-tight container
42 superconducting joint
44 superconducting switch
46 superconducting magnet device
48 gas-tight container
50 matrix
52 power supply

The invention claimed is:

1. A superconducting magnet device, including
at least one coil winding of superconducting wire having a critical temperature, configured for generating a static magnetic field $B_0$,
wherein the at least one coil winding is adapted to establish a thermally conductive contact with a cold head of a cryocooler that is configured for bringing to and keeping the at least one coil winding at a temperature below the critical temperature, and
at least one gas-tight container that permanently contains an amount of helium in fluid-isolation, wherein the at least one gas-tight container is in thermally conductive contact to the at least one coil winding for taking up thermal energy from the at least one coil winding in at least one operational state.

2. The superconducting magnet device of claim 1, further comprising at least one superconducting member that is distinct from the at least one coil winding and has a critical temperature, wherein the at least one gas-tight container is in thermally conductive contact to the at least one superconducting member for taking up thermal energy in at least one operational state.

3. The superconducting magnet device of claim 1, comprising at least two gas-tight containers that permanently contain an amount of helium, wherein the one gas-tight container of the two gas-tight containers is in thermally conductive contact to the at least one coil winding for taking up thermal energy from the at least one coil winding in at least one operational state, and the other gas-tight container of the two gas-tight containers is in thermally conductive contact to the at least one superconducting member for taking up thermal energy from the at least one superconducting member in at least one operational state.

4. The superconducting magnet device of claim 1, wherein the amount of helium contained in the at least one gas-tight container lies in a range between 25 kg/m$^3$ and 35 kg/m$^3$.

5. The superconducting magnet device of claim 1, comprising a plurality of gas-tight containers, each gas-tight container of the plurality of gas-tight containers containing an individual amount of helium, wherein the gas-tight containers are in thermally conductive contact to at least one out of the at least one coil winding and the at least one superconducting member that is distinct from the at least one coil winding.

6. The superconducting magnet device of claim 1, wherein the at least one gas-tight container or the gas-tight containers of the plurality of gas-tight containers are substantially made from a lightweight metal.

7. The superconducting magnet device of claim 1, wherein the plurality of gas-tight containers is held with a solid matrix.

8. The superconducting magnet device of claim 1, wherein the at least one cold head of the cryocooler has a nominal operation temperature of 4 K.

9. The superconducting magnet device of claim 1, wherein the at least one coil winding of superconducting wire is in thermally conductive contact with the cold head of a cryocooler that is configured for bringing to and keeping the at least one coil winding at a temperature below the critical temperature.

10. The superconducting magnet device of claim 1, for use as main magnet of a magnetic resonance imaging system, configured for generating a static magnetic field $B_0$ in an examination space of the magnetic resonance imaging system.

11. A magnetic resonance imaging system that is configured for acquiring magnetic resonance images from at least a portion of a subject of interest, comprising a superconducting magnet device of claim 1.

\* \* \* \* \*